United States Patent
Oh et al.

(10) Patent No.: US 11,374,016 B2
(45) Date of Patent: Jun. 28, 2022

(54) SEMICONDUCTOR MEMORY DEVICE WITH CHIP-TO-CHIP BONDING STRUCTURE

(71) Applicant: SK hynix Inc., Icheon-si (KR)

(72) Inventors: Sung Lae Oh, Cheongju-si (KR); Dong Hyuk Kim, Seoul (KR); Tae Sung Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 16/811,481

(22) Filed: Mar. 6, 2020

(65) Prior Publication Data

US 2021/0057360 A1  Feb. 25, 2021

(30) Foreign Application Priority Data

Aug. 22, 2019  (KR) ........................ 10-2019-0103142

(51) Int. Cl.
| | |
|---|---|
| *H01L 27/1157* | (2017.01) |
| *H01L 27/11524* | (2017.01) |
| *H01L 27/11529* | (2017.01) |
| *H01L 27/11573* | (2017.01) |
| *G06F 3/06* | (2006.01) |
| *G11C 5/06* | (2006.01) |
| *G11C 11/4094* | (2006.01) |
| *G11C 5/02* | (2006.01) |
| *G11C 11/4097* | (2006.01) |
| *G11C 11/4074* | (2006.01) |
| *G11C 11/4093* | (2006.01) |

(52) U.S. Cl.
CPC ........ *H01L 27/1157* (2013.01); *G06F 3/0656* (2013.01); *G11C 5/025* (2013.01); *G11C 5/063* (2013.01); *G11C 11/4074* (2013.01); *G11C 11/4093* (2013.01); *G11C 11/4094* (2013.01); *G11C 11/4097* (2013.01); *H01L 27/11524* (2013.01); *H01L 27/11529* (2013.01); *H01L 27/11573* (2013.01); *H01L 2224/08148* (2013.01); *H01L 2924/1438* (2013.01)

(58) Field of Classification Search
CPC ........ H01L 27/11524; H01L 27/11529; H01L 27/1157; H01L 27/11573; G11C 5/025; G11C 5/063; G11C 16/24; G11C 16/26; G11C 11/4094; G11C 11/4074; G11C 11/4093; G11C 11/4097; G06F 3/0656
See application file for complete search history.

(56) References Cited

U.S. PATENT DOCUMENTS 11,176,989 B2 * 11/2021 Oh ........................... G11C 5/06
2018/0374864 A1    12/2018 Fukuzumi et al.

FOREIGN PATENT DOCUMENTS

KR    10-2013-0071688 A    7/2013

* cited by examiner

*Primary Examiner* — David A Zarneke

(57) ABSTRACT

A semiconductor memory device includes: a plurality of page buffers disposed on a substrate; and a plurality of pads exposed to one surface of a dielectric layer covering the page buffers, and coupled to the respective page buffers. The substrate comprises a plurality of high voltage regions and a plurality of low voltage regions which are alternately disposed in a second direction crossing a first direction. Each of the plurality of page buffers comprises a sensing unit and a bit line select transistor coupled between the sensing unit and the one of the plurality of pads. The bit line select transistors of the plurality of page buffers are disposed in the plurality of high voltage regions, and the plurality of pads are distributed and disposed in a plurality of pad regions which correspond to the high voltage regions and are spaced apart from each other in the second direction.

19 Claims, 15 Drawing Sheets

SEMICONDUCTOR MEMORY DEVICE WITH CHIP-TO-CHIP BONDING STRUCTURE

CROSS-REFERENCE TO RELATED APPLICATION

The present application claims priority under 35 U.S.C. § 119(a) to Korean Patent Application No. 10-2019-0103142 filed in the Korean Intellectual Property Office on Aug. 22, 2019, which is incorporated herein by reference in its entirety.

BACKGROUND

1. Field

Exemplary embodiments relate to a semiconductor memory device, and more particularly, to a semiconductor memory device with a chip-to-chip bonding structure.

2. Discussion of the Related Art

A volatile memory device may write and read data at high speed, but lose data stored therein when power supply is removed. A nonvolatile memory device may write and read data at relatively low speed, but retain data stored therein even though power supply is removed. Thus, in order to store data which need to be retained regardless of whether power is supplied, the nonvolatile memory device is used. Examples of nonvolatile memory devices include a ROM (Read Only Memory), MROM (Mask ROM), PROM (Programmable ROM), EPROM (Erasable Programmable ROM), EEPROM (Electrically Erasable Programmable ROM), flash memory, PRAM (Phase change Random Access Memory), MRAM (Magnetic RAM), RRAM (Resistive RAM), FRAM (Ferroelectric RAM) and the like. Flash memory may be divided into NOR flash memory and NAND flash memory.

Among the nonvolatile memory devices, the NAND flash memory device is widely used as a data storage device. The NAND flash memory device may perform an operation required for reading and outputting data stored in memory cells, using a plurality of page buffers.

As a method for reducing the size of a semiconductor memory device, a memory cell array and a logic circuit are not fabricated on a single chip, but fabricated on separate chips, and the chips are then bonded to each other and formed as one body.

SUMMARY

Various embodiments are directed to a semiconductor memory device capable of contributing to improving the yield.

In an embodiment, a semiconductor memory device may include: a plurality of page buffers disposed on a substrate; and a plurality of pads exposed to one surface of a dielectric layer covering the page buffers, and coupled to the respective page buffers. The substrate may include a plurality of high voltage regions and a plurality of low voltage regions which are alternately disposed in a second direction crossing a first direction. Each of the plurality of page buffers may include a sensing unit and a bit line select transistor coupled between the sensing unit and one of the plurality of pads. The bit line select transistors of the plurality of page buffers may be disposed in the plurality of high voltage regions, and the plurality of pads may be distributed and disposed in a plurality of pad regions which correspond to the plurality of high voltage regions and are spaced apart from each other in the second direction.

In an embodiment, a semiconductor memory device may include: a peripheral wafer comprising a plurality of page buffers and a plurality of first pads coupled to the respective page buffers, and having one surface with the first pads disposed thereon; and a cell wafer comprising: a plurality of second pads disposed at one surface and bonded to the one surface of the peripheral wafer and coupled to the respective first pads; a plurality of bit lines coupled to the plurality of second pads, extended in a second direction crossing a first direction, and disposed in the first direction; and a memory cell array coupled to the plurality of bit lines. Each of the plurality of page buffers may include a sensing unit configured to sense a signal of the bit line and a bit line select transistor coupled between the sensing unit and the first pad. The peripheral wafer may include a plurality of high voltage regions and a plurality of low voltage regions which are alternately disposed in the second direction. The bit line select transistors of the plurality of page buffers may be disposed in the plurality of high voltage regions. The plurality of first pads may be disposed in a plurality of pad regions which correspond to the plurality of high voltage regions and are spaced apart from each other in the second direction.

DETAILED DESCRIPTION

Figure 1:
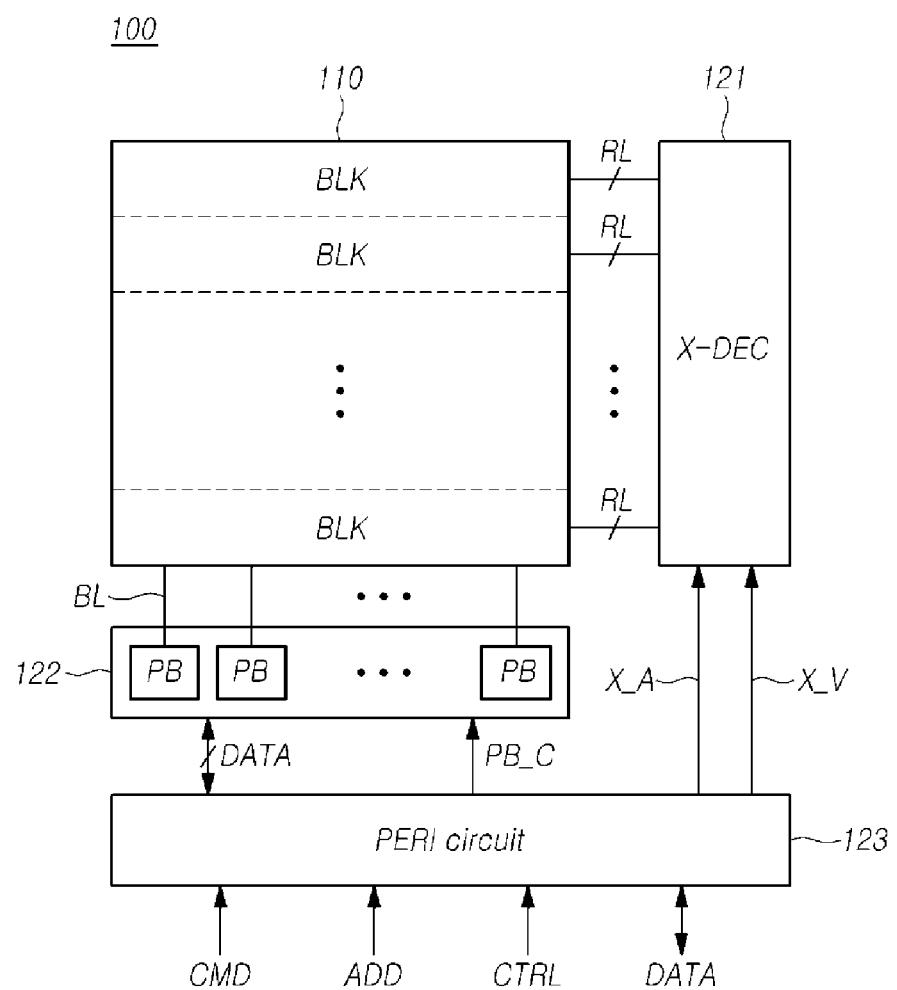
FIG. 1 is a block diagram illustrating a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative, and the present disclosure is not limited to the illustrated matters. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one element from the other and do not to imply or suggest the substances, order, sequence or number of the elements. Also, elements in embodiments of the disclosure are not limited by these terms. These terms are used to merely distinguish one element from another. Accordingly, as used herein, a first element may be a second element within the technical spirit of the disclosure.

If an element is described as "connected," "coupled" or "linked" to another element, the element may be directly "connected," "coupled" or "linked," but still another element is interposed therebetween or the respective elements may be indirectly "connected," "coupled" or "linked" via a third element. In describing positional relationship, such as "an element A on an element B," "an element A above an element B," "an element A below an element B" and "an element A next to an element B," another element C may be disposed between the elements A and B unless the term "directly" or "immediately" is explicitly used. When a positional relationship is described, for example, when a positional relationship between two elements, such as 'on', 'over', 'under' or 'beside' is described, one or more other elements may be located between the two elements, as long as a term such as 'directly' or 'immediately' is not used.

Also, features of various exemplary embodiments of the disclosure may be coupled, combined or separated partially or totally. Technically various interactions and operations are possible. Various exemplary embodiments can be carried out individually or in combination.

Hereinafter, embodiments of the disclosure will be described in detail with reference to the accompanying drawings.

FIG. 1 is a block diagram illustrating a semiconductor memory device in accordance with an embodiment of the disclosure.

Referring to FIG. 1, the semiconductor memory device 100 in accordance with the present embodiment may include a memory cell array 110, a row decoder (X-DEC) 121, a page buffer circuit 122 and a peripheral (PERI) circuit 123.

The memory cell array 110 may include a plurality of memory blocks BLK. Although not illustrated, each of the memory blocks BLK may include a plurality of cell strings. Each of the cell strings may include one or more drain select transistors, a plurality of memory cells and one or more source select transistors, which are coupled in series. The memory cells may be volatile memory cells or nonvolatile memory cells. Hereafter, it will be described that an example of the semiconductor memory device 100 is a vertical NAND flash device, but it should be understood that the technical spirit of the present disclosure is not limited thereto.

The memory cell array 110 may be coupled to the X-DEC 121 through row lines RL. The row lines RL may include one or more drain select lines, a plurality of word lines and one or more source select lines. The memory cell array 110 may be coupled to the page buffer circuit 122 through bit lines BL.

The X-DEC 121 may select any one of the memory blocks BLK included in the memory cell array 110 in response to a row address X_A provided from the PERI circuit 123. The X-DEC 121 may transfer an operation voltage X_V provided from the PERI circuit 123 to row lines RL coupled to the selected memory block among the memory blocks BLK included in the memory cell array 110.

The page buffer circuit 122 may include a plurality of page buffers PB coupled to the respective bit lines BL. The page buffer circuit 122 may receive a page buffer control signal PB_C from the PERI circuit 123, and transmit/receive a data signal DATA to/from the PERI circuit 123. The page buffer circuit 122 may control the bit lines BL, arranged in the memory cell array 110, in response to the page buffer control signal PB_C. For example, the page buffer circuit 122 may detect data stored in a memory cell of the memory cell array 110 by sensing a signal of the corresponding bit line BL of the memory cell array 110 in response to the page buffer control signal PB_C, and transmit the data signal DATA to the PERI circuit 123 according to the detected data. The page buffer circuit 122 may apply a signal to a bit line BL based on the data signal DATA received from the PERI circuit 123 in response to the page buffer control signal PB_C, and thus write data to a memory cell of the memory cell array 110. The page buffer circuit 122 may write data to a memory cell coupled to an enabled word line or read data from the memory cell.

The PERI circuit 123 may receive a command signal CMD, an address signal ADD and a control signal CTRL from the outside of the semiconductor memory device 100, and transmit/receive data DATA to/from an external device of the semiconductor memory device 100, for example, a memory controller. The PERI circuit 123 may output signals for writing data to the memory cell array 110 or reading data from the memory cell array 110, for example, the row address X_A, the page buffer control signal PB_C and the like, based on the command signal CMD, the address signal ADD and the control signal CTRL. The PERI circuit 123 may generate various voltages requested by the semiconductor memory device 100, which include the operation voltage X_V.

Hereafter, in the accompanying drawings, two directions which cross each other while being parallel to the top surface of a substrate and/or a source plate will be defined as a first direction FD and a second direction SD, respectively, and a direction perpendicular to the top surface of the substrate and/or the source plate will be defined as a third direction TD. For example, the first direction FD may correspond to the extension direction of the word lines, and the second direction SD may correspond to the extension direction of the bit lines. The first direction FD and the second direction SD may cross each other substantially at right angles. The third direction TD may correspond to a direction perpendicular to the first and second directions FD and SD. In the following descriptions of this specification, 'vertical' or 'vertical direction' will be used as substantially the same meaning as the third direction TD. In the drawings, a direction indicated by an arrow and the opposite direction thereof represent the same direction.

Figure 2:
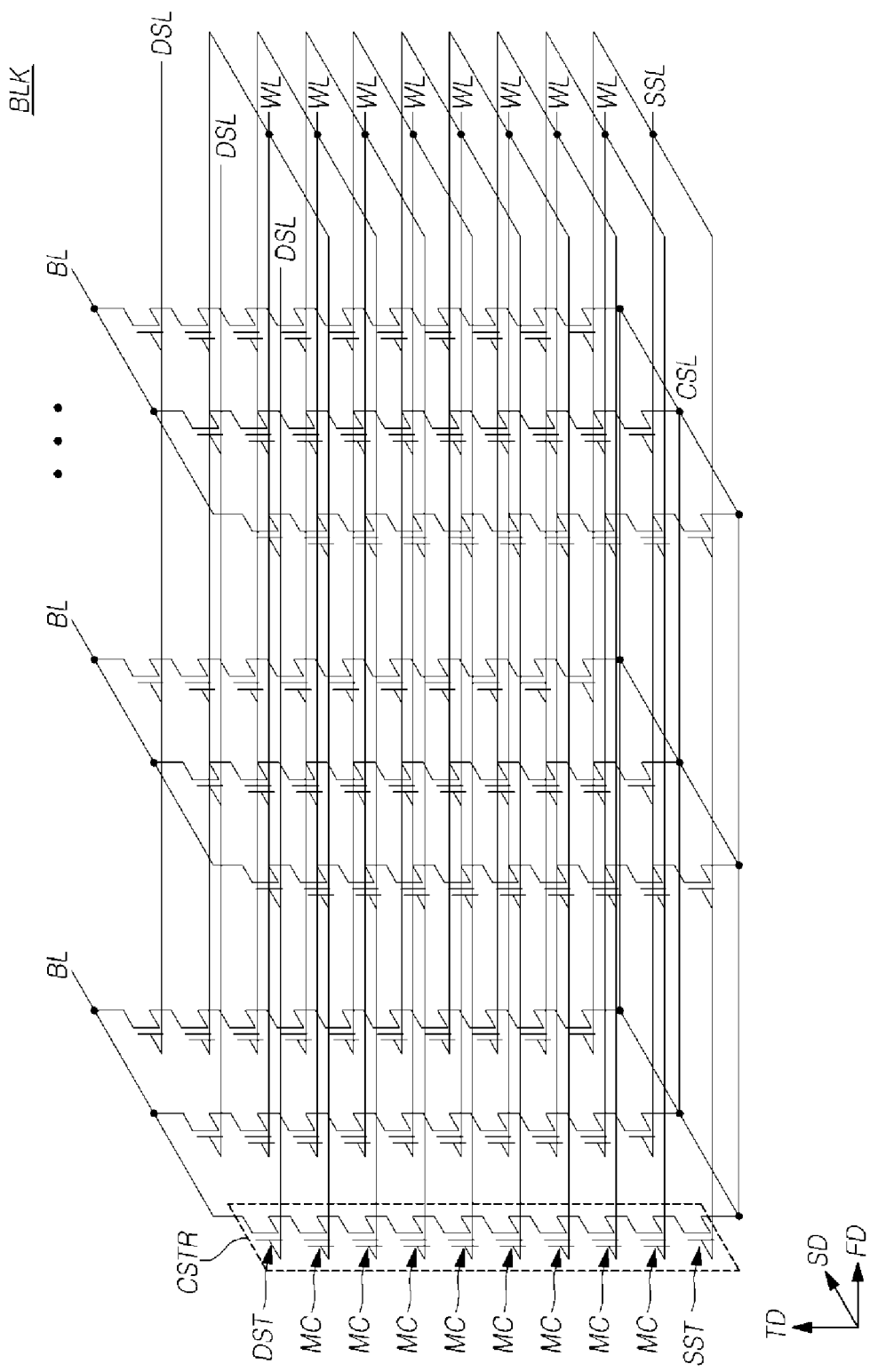
FIG. 2 is an equivalent circuit diagram of a memory block illustrated in FIG. 1.

FIG. 2 is an equivalent circuit diagram of a memory block illustrated in FIG. 1.

Referring to FIG. 2, the memory block BLK may include a plurality of cell strings CSTR coupled between the plurality of bit lines BL and a common source line CSL.

The bit lines BL may be extended in the second direction SD and arranged in the first direction FD. The plurality of cell strings CSTR may be coupled to each of the bit lines BL in parallel. The cell strings CSTR may be coupled to the common source line CSL in common. Between the plurality of bit lines BL and one common source line CSL, the plurality of cell strings CSTR may be disposed.

Each of the cell strings CSTR may include a drain select transistor DST coupled to the corresponding bit line BL, a source select transistor SST coupled to the common source line CSL, and a plurality of memory cells MC coupled between the drain select transistor DST and the source select transistor SST. The drain select transistor DST, the memory cells MC and the source select transistor SST may be coupled in series in the third direction TD.

Between the bit lines BL and the common source line CSL, the drain select lines DSL, the plurality of word lines WL and the source select line SSL may be disposed in the third direction TD. The drain select lines DSL may be coupled to the gates of the corresponding drain select transistors DST. The word lines WL may be coupled to the gates of the corresponding memory cells MC. The source select line SSL may be coupled to the gates of the source select transistors SST. The memory cells MC included in the memory block BLK may be divided on a physical or logical page basis. For example, memory cells which are coupled to different cell strings CSTR while sharing one word line WL may constitute one physical page.

Figure 3:
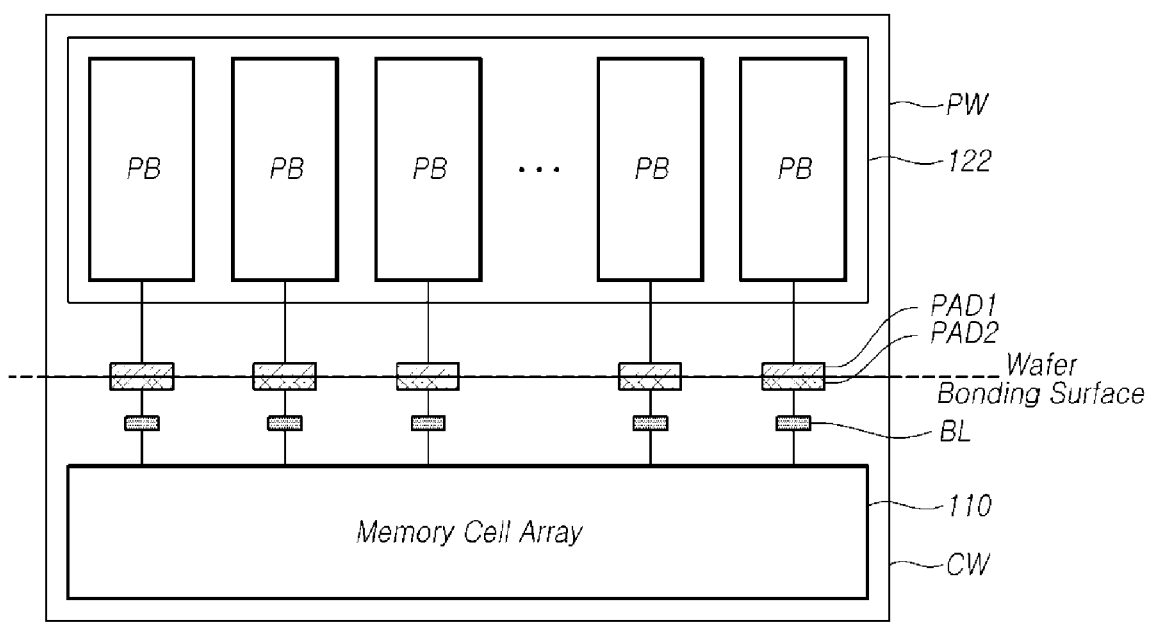
FIG. 3 is a diagram schematically illustrating a semiconductor memory device in accordance with an embodiment of the disclosure.

FIG. 3 is a diagram schematically illustrating a semiconductor memory device in accordance with an embodiment of the disclosure.

Referring to FIG. 3, the semiconductor memory device may include a cell wafer CW and a peripheral wafer PW. The page buffer circuit 122 may be disposed in the peripheral wafer PW. Although not illustrated, the X-DEC 121 and the PERI circuit 123, which have been described with reference to FIG. 1, may be further disposed in the peripheral wafer PW. The page buffer circuit 122 may include a plurality of page buffers PB. The peripheral wafer PW may include a plurality of first pads PAD1 coupled to the page buffers PB. The first pads PAD1 may be exposed to one surface of the peripheral wafer PW.

The memory cell array 110 may be disposed in the cell wafer CW. The memory cell array 110 may be coupled to the bit lines BL. The cell wafer CW may include second pads PAD2 coupled to the bit lines BL. The second pads PAD2 may be exposed to one surface of the cell wafer CW. The second pads PAD2 may correspond to the respective first pads PAD1. The first pads PAD1 and the second pads PAD2, which correspond to each other, may have substantially the same size while disposed to face each other. The first pads PAD1 and the second pads PAD2 may have a mirror symmetry structure. The one surface of the peripheral wafer PW may be bonded to the one surface of the cell wafer CW, such that the first pads PAD1 are coupled to the corresponding second pads PAD2.

When a misalignment occurs in the wafer bonding step, the misalignment may cause a bonding defect in which the first pads PAD1 are not coupled to the corresponding second pads PAD2.

When the first pads PAD1 have a small size, and the adjacent first pads PAD1 have a small distance therebetween, a margin for proper alignment in the wafer bonding process may become so tight as to make the first pads PAD1 vulnerable to a bonding defect. Therefore, both the size of the first pads PAD1 and the distance between the adjacent first pads PAD1 need to be increased, i.e., the pitch of the first pads PAD1 needs to be increased. However, when the pitch of the first pads PAD1 is increased, the overall size of the semiconductor memory device may be increased. The present embodiments may suggest a method capable of increasing the pitch of the first pads without increasing the size of the semiconductor memory device.

Figure 4:
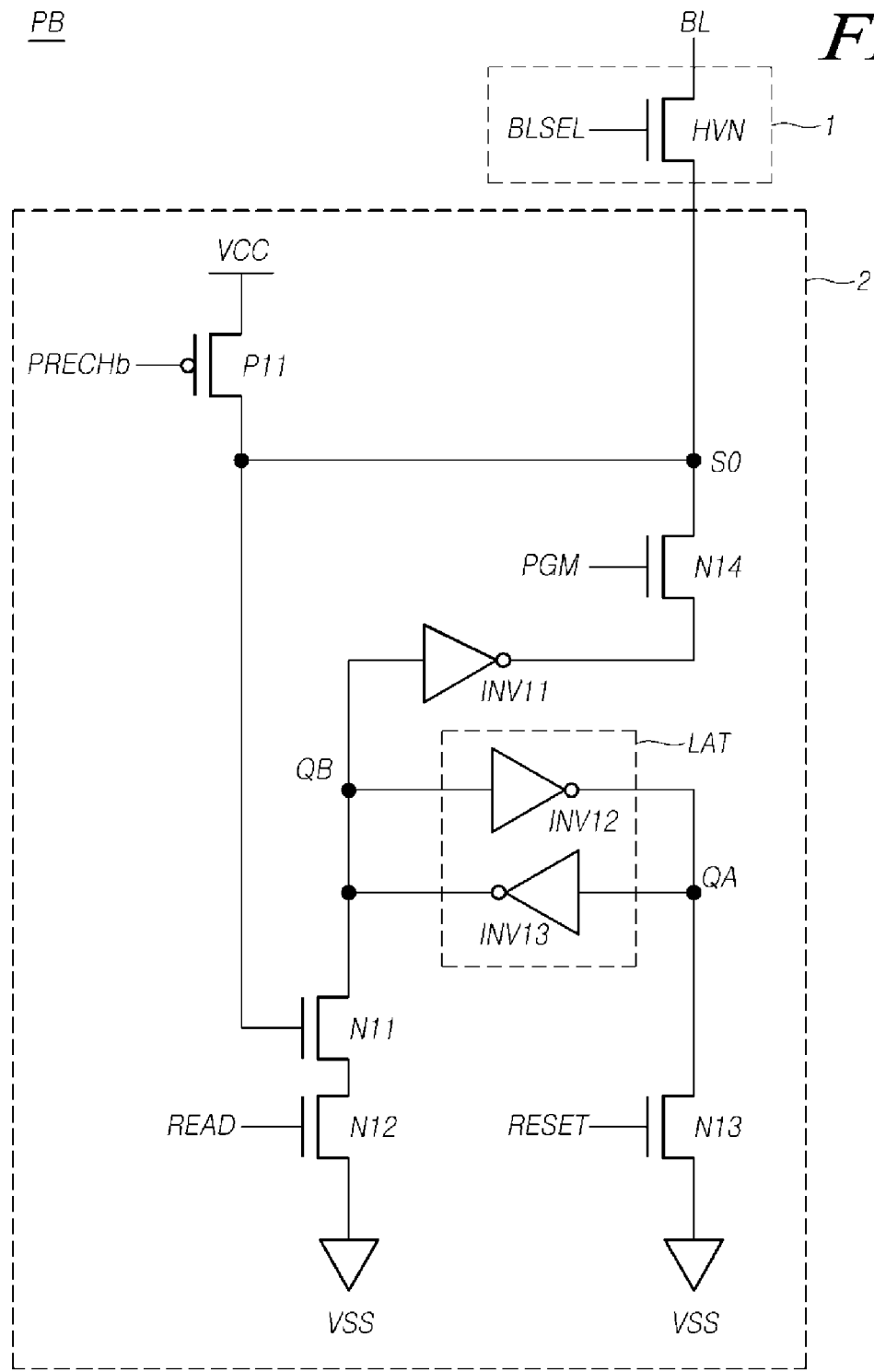
FIG. 4 is a circuit diagram of a page buffer illustrated in FIG. 3.

FIG. 4 is a circuit diagram of the page buffer illustrated in FIG. 3.

Referring to FIG. 4, the page buffer PB may include a bit line selection unit 1 configured to selectively couple the bit line BL to a sensing node S0 and a sensing unit 2 configured to sense data of the bit line BL through the sensing node S0.

The bit line selection unit 1 may include a bit line select transistor HVN coupled between the bit line BL and the sensing node S0. The bit line select transistor HVN may operate in response to a bit line selection signal BLSEL. When the bit line selection signal BLSEL is enabled, the bit line select transistor HVN may couple the bit line BL and the sensing node S0 to each other. When the bit line selection signal BLSEL is disabled, the bit line select transistor HVN may isolate the bit line BL and the sensing node S0 from each other. In this case, the bit line BL may float.

The sensing unit 2 may include a PMOS transistor P11, a plurality of NMOS transistors N11 to N14, a latch LAT and an inverter INV11.

The PMOS transistor P11 may be coupled between a supply voltage VCC and the sensing node S0, and may transfer the supply voltage VCC to the sensing node S0 in response to a precharge signal PRECHb. The latch LAT may include inverters INV12 and INV13 which are coupled in parallel to each other in reverse directions between a first node QA and a second node QB. The NMOS transistors N11 and N12 may be coupled in series between the second node QB and a ground voltage VSS, and couple the second node QB and the ground voltage VSS in response to the potential of the sensing node S0 and a read signal READ, respectively. When the NMOS transistors N11 and N12 are turned on at the same time, the second node QB and the ground voltage VSS may be coupled to each other. The NMOS transistor N13 may be coupled between the first node QA and the ground voltage VSS, and couple the first node QA and the ground voltage VSS in response to a reset signal RESET. The inverter INV11 may be coupled to the second node QB, and invert and output a signal of the second node QB. The NMOS transistor N14 may be coupled between an output terminal of the inverter INV11 and the sensing node S0, and transmit the output signal of the inverter INV11 to the sensing node S0 in response to a program signal PGM.

The bit line select transistor HVN may be configured as a high voltage transistor to withstand a high voltage applied to the bit line BL during an erase operation. That is, the bit line select transistor HVN may have a long channel structure.

During the erase operation, the bit line selection signal BLSEL may be disabled. Therefore, the high voltage applied to the bit line BL may be interrupted by the bit line select transistor HVN so as not to be transferred to the sensing unit 2. Since the high voltage is not transferred to the elements constituting the sensing unit 2, i.e. the PMOS transistor P11, the NMOS transistors N11 to N14, the latch LAT and the inverter INV11, the elements constituting the sensing unit 2 may be configured as low voltage transistors.

Figure 5:
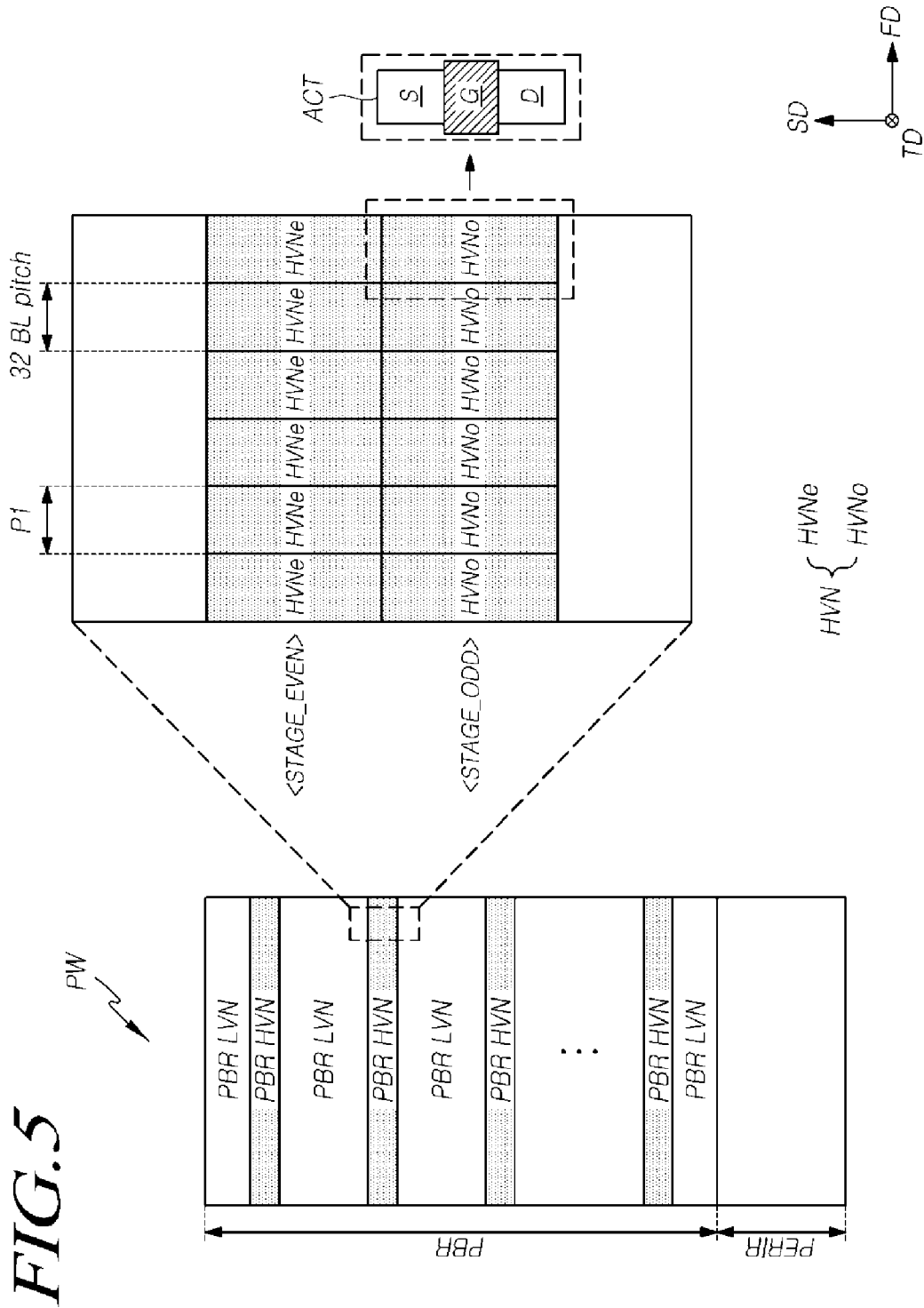
FIG. 5 is a plan view schematically illustrating a peripheral wafer of a semiconductor memory device in accordance with an embodiment of the disclosure.
Figure 6:
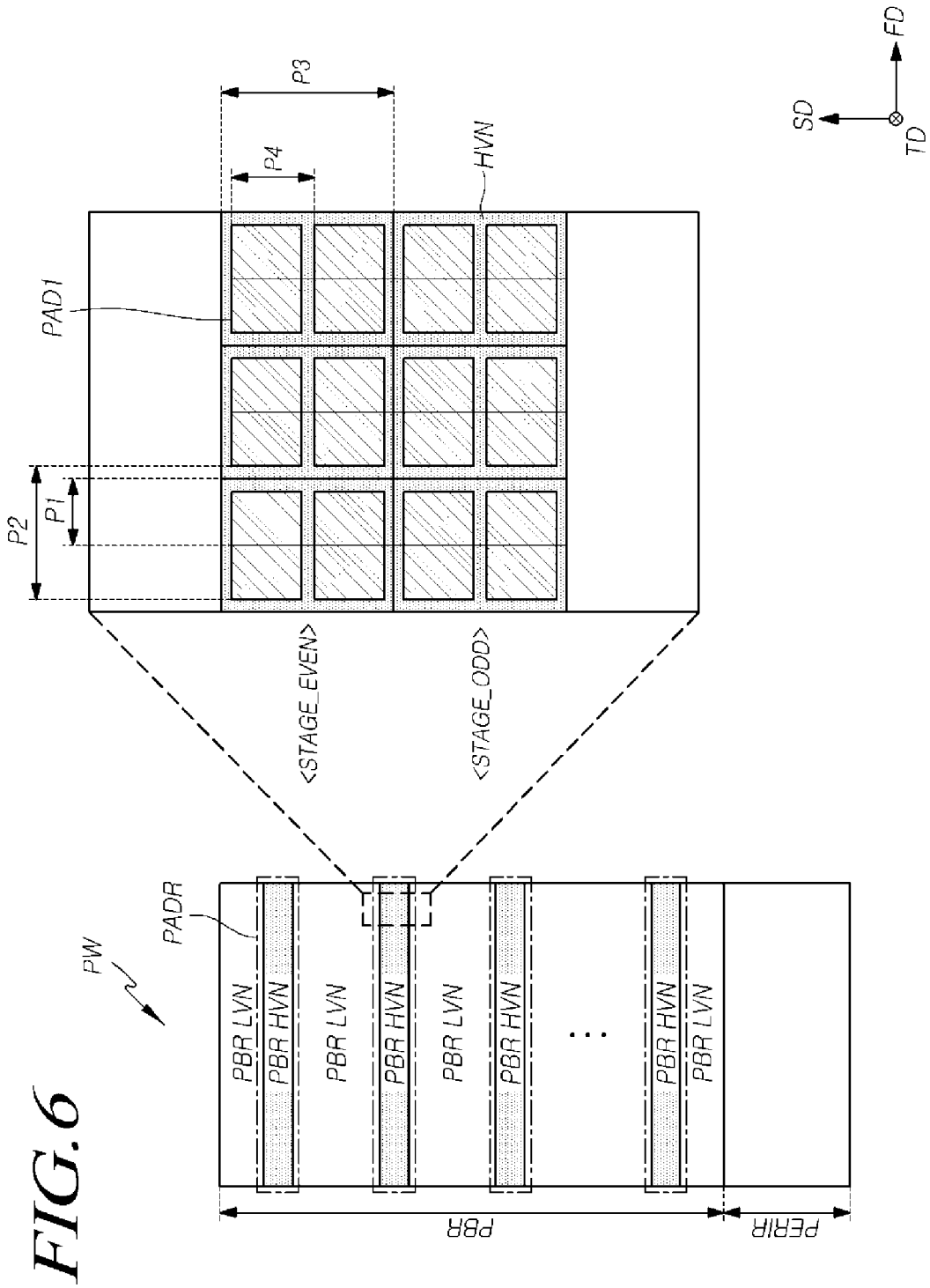
FIG. 6 is a plan view illustrating a layout of peripheral wafer-side pads of a semiconductor memory device in accordance with an embodiment of the disclosure.

FIG. 5 is a plan view schematically illustrating a peripheral wafer of a semiconductor memory device in accordance an embodiment of the disclosure, and FIG. 6 is a plan view illustrating a layout of peripheral wafer-side pads of a semiconductor memory device in accordance with an embodiment of the disclosure.

Referring to FIG. 5, the peripheral wafer PW may include a page buffer region PBR and a PERI region PERIR. The page buffer region PBR and the PERI region PERIR may be disposed in the second direction SD. The page buffers PB of FIG. 1 may be disposed in the page buffer region PBR. The PERI circuit 123 of FIG. 1 may be disposed in the PERI region PERIR.

The page buffer region PBR may include a plurality of low voltage regions PBRLVN and a plurality of high voltage regions PBRHVN. The low voltage regions PBRLVN may be disposed in the second direction SD. Each of the high voltage regions PBRHVN may be disposed between a pair of low voltage regions PBRLVN adjacent to high voltage regions PBRHVN. The low voltage regions PBRLVN and the high voltage regions PBRHVN may be alternately disposed in the second direction SD.

The bit line select transistors HVN of the page buffers may be disposed in the high voltage regions PBRHVN. The sensing units 2 (see FIG. 4) of the page buffers may be disposed in the low voltage regions PBRLVN. The bit line select transistors HVN may include even bit line select transistors HVNe coupled to even bit lines and odd bit line select transistors HVNo coupled to odd bit lines.

In FIG. 5, a box with HVNe marked in the center thereof indicates a unit region allocated to the layout of one even bit line select transistor, and a box with HVNo marked in the center thereof indicates a unit region allocated to the layout of one odd bit line select transistor.

The length of the box represented by HVNe or HVNo in the first direction FD may correspond to the pitch of the even or odd bit line select transistors in the first direction FD, and the length of the box represented by HVNe or HVNo in the second direction SD may correspond to the pitch of the even or odd bit line select transistors in the second direction SD. The pitch of the even or odd bit line select transistors HVNe or HVNo in the first direction FD may be defined as a first pitch P1, which is 32 times larger than the pitch of the bit lines (BL pitch) in the first direction FD.

In each of the high voltage regions PBRHVN, the bit line select transistors HVN may be disposed in a plurality of stages <STAGE_EVEN> and <STAGE_ODD>. For example, the even bit line select transistors HVNe may be disposed in the even stage <STAGE_EVEN>, and the odd bit line select transistors HVNo may be disposed in the odd stage <STAGE_ODD>. The number of the even bit line select transistors HVNe disposed in the even stage <STAGE_EVEN> may be equal to the number of the odd bit line select transistors HVNo disposed in the odd stage <STAGE_ODD>.

In each of the stages <STAGE_EVEN> and <STAGE_ODD>, the bit line select transistors HVN may be disposed in one column in the first direction FD. The bit line select transistor HVN may include a gate G formed across an active region ACT in the first direction FD, and a source S and drain D disposed in the active region ACT on both sides of the gate G. The channel length direction of the bit line select transistor HVN may correspond to the second direction SD, and the channel width direction of the bit line select transistor HVN may correspond to the first direction FD.

The bit line select transistors HVN may have a long channel structure. Thus, the pitch of the bit line select transistors HVN in the second direction SD may be larger than the pitch P1 of the bit line select transistors HVN in the first direction FD.

Referring to FIGS. 5 and 6, a plurality of pad regions PADR corresponding to the high voltage regions PBRHVN may be provided. The pad regions PADR may be spaced apart from each other with a distance provided therebetween in the second direction SD.

The pad regions PADR may overlap the respective high voltage regions PBRHVN. When seen in a top view, the pad regions PADR may be substantially the same as the high voltage regions PBRHVN. The distance between the adjacent pad regions PADR may be substantially equal to the length of the low voltage region PBRLVN in the second direction SD.

Each of the pad regions PADR may have a plurality of first pads PAD1 disposed therein. Each of the first pads PAD1 may be coupled to the bit line select transistor HVN through a via and a wiring line, which are not illustrated.

The layout of the first pads PAD1 may be different from the layout of the bit line select transistors HVN. Specifically, in each of the stages <STAGE_EVEN> and <STAGE_ODD>, the bit line select transistors HVN may be disposed in one column in the first direction FD, and the first pads PAD1 may be disposed across two columns in the first direction FD. For example, in FIG. 6, the first pads PAD1 are disposed across two columns in each of the stages <STAGE_EVEN> and <STAGE_ODD>. However, the present embodiment is not limited thereto. In each of the stages <STAGE_EVEN> and <STAGE_ODD>, the first pads PAD1 may be disposed across three or more columns.

The first pads PAD1 may be repeatedly disposed with a second pitch P2 in the first direction FD. The second pitch P2 may be defined as the sum of the length of one first pad PAD1 in the first direction FD and the distance between the adjacent first pads PAD1 in the first direction FD. The second pitch P2 may be larger than the first pitch P1, which indicates the pitch of the bit line select transistors HVN in the first direction FD. In an embodiment, the second pitch P2 may be twice larger than the first pitch P1.

Each of the first pads PAD1 may overlap, in the first direction FD, two or more bit line select transistors HVN disposed adjacent to each other. The number of the first pads PAD1 disposed in a row or line in the first direction FD may be smaller than the number of the bit line select transistors HVN disposed in a row or line in the first direction FD. For example, when the second pitch P2 is twice as large as the first pitch P1, the number of the first pads PAD1 disposed in a line in the first direction FD may be half the number of the bit line select transistors HVN disposed in a line in the first direction FD.

The pitch of the bit line select transistors HVN in the second direction SD may be defined as a third pitch P3. The pitch of the first pads PAD1 in the second direction SD may be defined as a fourth pitch P4. The fourth pitch P4 may be defined as the sum of the length of one first pad PAD1 in the second direction SD and the distance between the adjacent first pads PAD1 in the second direction SD. The fourth pitch P4 may be smaller than the third pitch P3. In an example, the fourth pitch P4 is half of the third pitch P3. The number of the first pads PAD1 disposed in a column or line in the second direction SD may be larger than the number of the bit line select transistors HVN disposed in a column or line in the second direction SD. For example, when the fourth pitch P4 is half of the third pitch P3, the number of the first pads PAD1 disposed in a line in the second direction SD may be twice as large as the number of the bit line select transistors HVN disposed in a line in the second direction SD.

Figure 7:
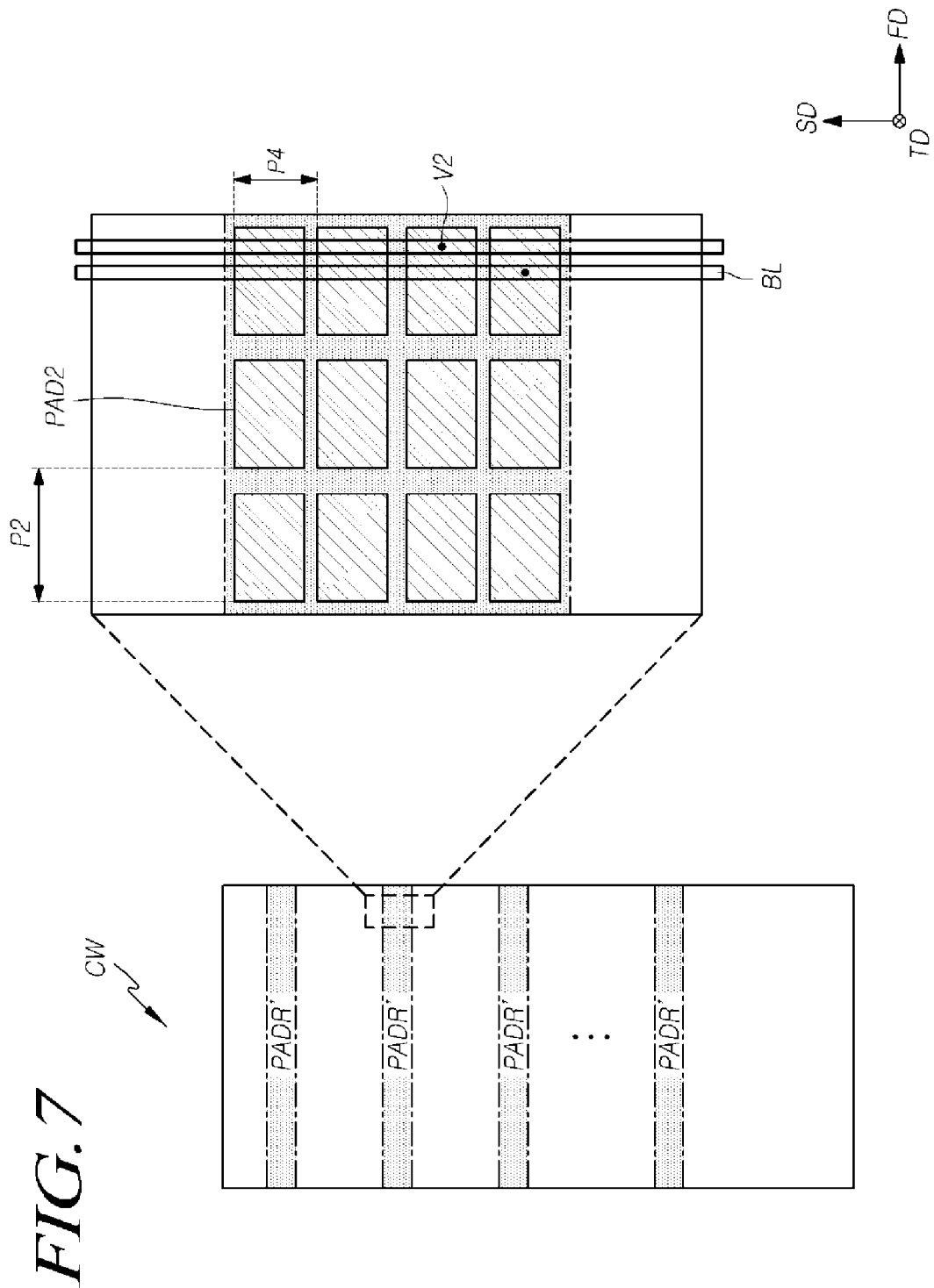
FIG. 7 is a plan view illustrating a layout of cell wafer-side pads of a semiconductor memory device in accordance with an embodiment of the disclosure.

FIG. 7 is a plan view illustrating a layout of cell wafer-side pads of a semiconductor memory device in accordance with an embodiment of the present invention.

Referring to FIG. 7, a plurality of pad regions PADR' corresponding to the peripheral wafer-side pad regions PADR (see FIG. 6) may be defined in the cell wafer CW. The pad regions PADR' may be disposed symmetrically with the pad regions PADR in the first and second directions while facing the pad regions PADR. Thus in a layout, if pad regions PADR are spaced apart from each other with a distance provided therebetween in the second direction SD, then the pad regions PADR' may be spaced apart from each other with a substantially similar distance provided therebetween in the second direction SD.

Each of the pad regions PADR' may have a plurality of second pads PAD2 disposed therein. The second pads PAD2 may have a symmetrical structure with the first pads PAD1 while facing the respective first pads PAD1.

The pitch of the second pads PAD2 in the first direction FD may be substantially equal to the pitch P2 of the first pads PAD1 in the first direction FD. Since the pitch P2 of the first pads PAD1 in the first direction FD is larger than the pitch P1 (see FIG. 6) of the bit line select transistors HVN in the first direction FD, the pitch of the second pads PAD2 in the first direction FD may also be larger than the pitch P1 of the bit line select transistors HVN in the first direction FD. For example, when the pitch P2 of the first pads PAD1 in the first direction FD is twice that of the pitch P1 of the bit line select transistors HVN in the first direction FD, the pitch of the second pads PAD2 in the first direction FD may also be twice as that of the pitch P1 of the bit line select transistors HVN in the first direction FD.

The number of the second pads PAD2 disposed in a row or line in the first direction FD may be substantially equal to the number of the first pads PAD1 disposed in a row or line in the first direction FD. Since the number of the first pads PAD1 disposed in a line in the first direction FD is smaller than the number of the bit line select transistors HVN disposed in a row or line in the first direction FD, the number of the second pads PAD2 disposed in a line in the first direction FD may also be smaller than the number of the bit line select transistors HVN disposed in a line in the first direction FD. For example, when the second pitch P2 is twice that of the first pitch P1, the number of the second pads PAD2 disposed in a line in the first direction FD may be half the number of the bit line select transistors HVN disposed in a line in the first direction FD.

The pitch of the second pads PAD2 in the second direction SD may be substantially equal to the pitch P4 of the first pads PAD1 in the second direction SD. For example, when the pitch of the first pads PAD1 in the second direction SD is half of the pitch P3 (see FIG. 6) of the bit line select transistors HVN in the second direction SD, the pitch P4 of the second pads PAD2 in the second direction SD may also be half of the pitch P3 of the bit line select transistors HVN in the second direction SD.

The number of the second pads PAD2 disposed in a column or line in the second direction SD may be substantially equal to the number of the first pads PAD1 disposed in a column or line in the second direction SD. Since the number of the first pads PAD1 disposed in a line in the second direction SD is larger than the number of the bit line select transistors HVN disposed in a column or line in the second direction SD, the number of the second pads PAD2 disposed in a line in the second direction SD may be larger than the number of the bit line select transistors HVN disposed in a line in the second direction SD. For example, when the fourth pitch P4 is half of the third pitch P3, the number of the second pads PAD2 disposed in a line in the second direction SD may be twice as large as the number of the bit line select transistors HVN disposed in a line in the second direction SD.

The second pads PAD2 may be coupled to the bit lines BL through vertical vias V2, respectively. In the vertical direction VD, a plurality of bit lines BL (for example, several tens of bit lines BL) may overlap the second pad PAD2. Because the bit lines BL are extended in the second direction SD, the bit lines BL and the second pads PAD2 can be coupled to each other even if a simple design change occurs, such as alteration of the number of the second pads PAD2 disposed in a line in the second direction SD. Such a design change may include changing the positions of the vertical vias V2. In order to simplify the drawing, FIG. 7 illustrates only two bit lines BL. However, it should be understood that a plurality of bit lines BL are disposed in the first direction FD.

Figure 8:
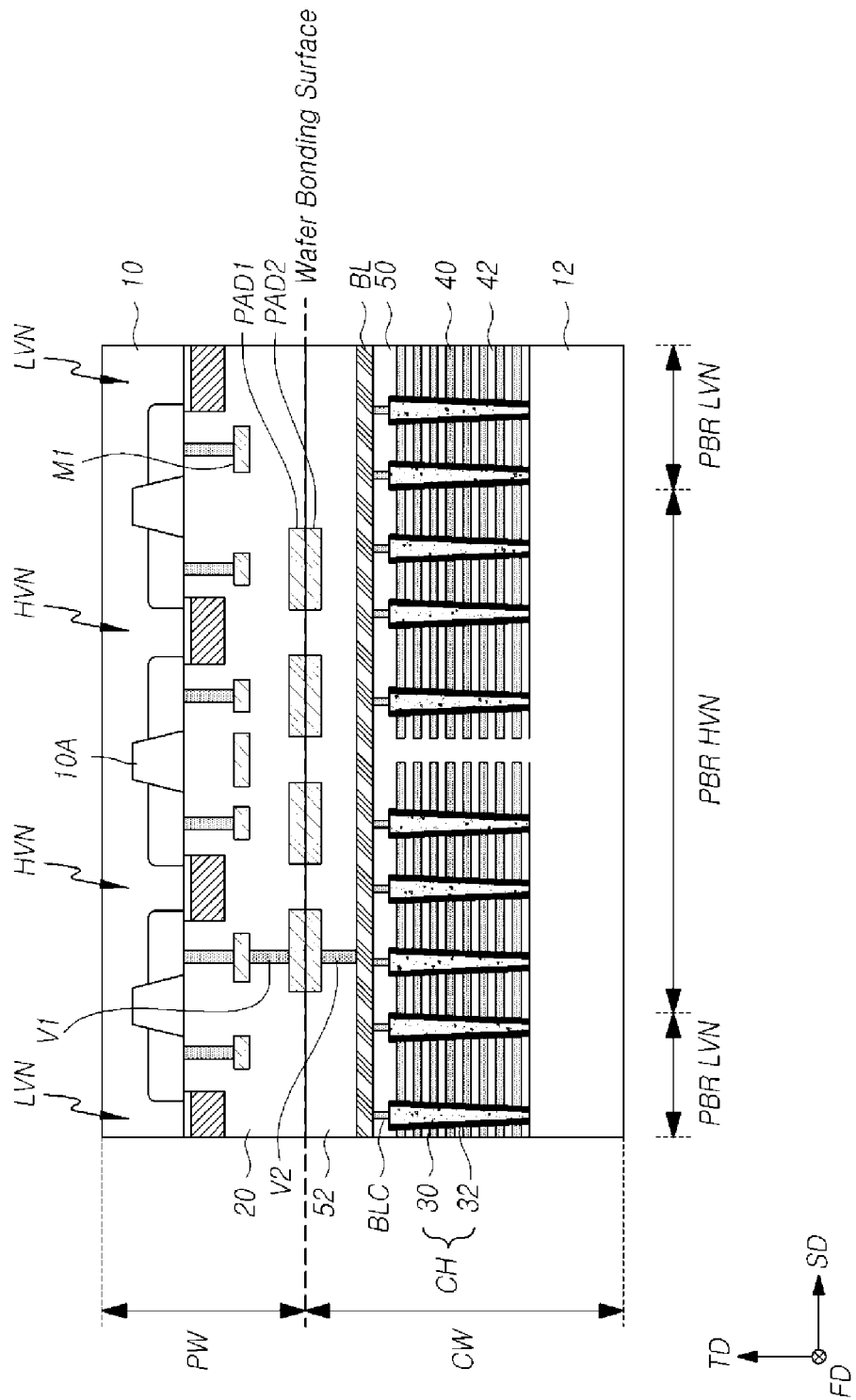
FIG. 8 is a cross-sectional view illustrating a portion of a semiconductor memory device in accordance with an embodiment of the disclosure.

FIG. 8 is a cross-sectional view illustrating a portion of a semiconductor memory device in accordance with an embodiment of the disclosure.

Referring to FIG. 8, the semiconductor memory device may have a POC (Peri Over Cell) structure. A peripheral wafer PW may be stacked over a cell wafer CW.

The peripheral wafer PW may include a first substrate 10, and the cell wafer CW may include a second substrate 12. The first substrate 10 and the second substrate 12 may include one or more of silicon (Si), germanium (Ge), silicon germanium (SiGe), gallium arsenic (GaAs), indium gallium arsenic (InGaAs) and aluminum gallium arsenic (AlGaAs) or compounds thereof. The first substrate 10 and the second substrate 12 may include a bulk silicon substrate, an SOI (Silicon On Insulator) substrate, a germanium substrate, a GOI (Germanium On Insulator) substrate, a silicon-germanium substrate, or an epitaxial thin film substrate acquired by performing SEG (Selective Epitaxial Growth).

Transistors LVN and HVN may be disposed in an active region of the first substrate 10, defined by an isolation layer 10A. In a low voltage region PBRLVN, low voltage transistors LVN may be disposed. The low voltage transistors LVN may constitute the sensing unit 2 (see FIG. 2) of the page buffers PB. In a high voltage region PBRHVN, bit line select transistors HVN may be disposed.

A dielectric layer 20 may be formed on the first substrate 10 so as to cover the transistors LVN and HVN. The dielectric layer 20 may include silicon oxide, for example, HDP (High Density Plasma) oxide or TEOS (Tetra-Ethyl-Ortho-Silicate) oxide. The cell wafer CW may be bonded to one surface of the dielectric layer 20. The first pads PAD1 may be provided at the one surface of the dielectric layer 20. The dielectric layer 20 may include wiring lines M1 and vertical vias V1, which are formed therein to couple the first pads PAD1 and the bit line select transistors HVN.

A plurality of vertical channels CH may be formed on the second substrate 12. Each of the vertical channels CH may include a channel layer 30 and a gate dielectric layer 32. The channel layer 30 may include polysilicon or single crystal silicon, and include P-type impurities such as boron (B) in a partial region thereof. In an example, the channel layer 30 may have a pillar shape which is completely filled up to the center thereof or a solid cylinder shape. In another example, the channel layer 30 may have a tube shape whose central region is open. In this case, a buried dielectric layer may be formed in the open central region of the channel layer 30. The gate dielectric layer 32 may have a straw or cylinder shell shape to surround the outer wall of the channel layer 30. Although not illustrated, the gate dielectric layer 32 may include a tunnel dielectric layer, a charge storage layer and a blocking layer, which are sequentially stacked from the outer wall of the channel layer 30 in an inward direction. The tunnel dielectric layer may include silicon oxide, hafnium oxide, aluminum oxide, zirconium oxide, tantalum oxide and the like. The charge storage layer may include silicon nitride, boron nitride, silicon boron nitride or polysilicon doped with impurities. The blocking layer may include a single layer of silicon oxide, silicon nitride, hafnium oxide, aluminum oxide, zirconium oxide or tantalum oxide or a stacked layer thereof. In some embodiments, the gate dielectric layer 32 may have an ONO (Oxide-Nitride-Oxide) stack structure in which oxide, nitride and oxide are sequentially stacked.

Over the second substrate 12, electrode layers 40 and interlayer dielectric layers 42 are alternately stacked along or around the vertical channels CH. The electrode layers 40 may include a conductive material. For example, the electrode layers 40 may include one or more selected from a doped semiconductor (ex, doped silicon), a metal (ex, tungsten, copper or aluminum), conductive metal nitride (ex, titanium nitride or tantalum nitride) or transition metal (ex, titanium or tantalum). The interlayer dielectric layer 42 may include silicon oxide.

The electrode layers 40 may constitute the row lines RL described with reference to FIG. 1. Among the electrode layers 40, one or more layers from the lowermost part may constitute a source select line, and one or more layers from the uppermost part may constitute a drain select line. The electrode layers 40 between the source select line and the drain select line may constitute word lines. In portions or areas where the electrode layers 40 surround the vertical channels CH, source select transistors, memory cells and drain select transistors may be formed.

Over the second substrate 12, a dielectric layer 50 may be formed to cover the electrode layers 40, the interlayer dielectric layers 42 and the vertical channels CH. The dielectric layer 50 may include silicon oxide, for example, HDP oxide or TEOS oxide. A bit line BL may be disposed on the dielectric layer 50. The bit line BL may be extended in the second direction SD. FIG. 8 illustrates only one bit line, but it should be understood that a plurality of bit lines are disposed in the first direction FD. Under the bit line BL, bit line contacts BLC may be formed to couple the bit line BL to the vertical channels CH. The vertical channels CH disposed in a line in the second direction SD may be connected to one bit line BL.

Over the dielectric layer 50, a dielectric layer 52 may be formed to cover the bit line BL. The dielectric layer 52 may include silicon oxide, for example, HDP oxide or TEOS oxide.

One surface of the dielectric layer 52 may be bonded to the peripheral wafer PW. The second pads PAD2 may be provided at one surface of the dielectric layer 52. Each of the second pads PAD2 may be coupled to the bit line BL through a vertical via V2.

The second pads PAD2 may correspond to the respective first pads PAD1. A first pad PAD1 and a second pad PAD2, which correspond to each other, may have a symmetrical structure while facing each other. The first pad PAD1 and the second pad PAD2, which correspond to each other, may be coupled to each other, and thus construct an electrical path to couple the bit line BL to the corresponding bit line select transistor HVN.

In accordance with an embodiment, the first pads PAD1 may be distributed and disposed in the plurality of pad regions PADR corresponding to the high voltage regions PBRHVN of the page buffer circuit, thereby increasing the pitch of the first pads PAD1 in one direction without increasing the size of the semiconductor memory device. Furthermore, the layout of the first pads PAD1 may be differently configured from the layout of the bit line select transistors HVN, in order to increase the pitch of the first pads PAD1 in the first direction FD even when the pitch of the bit line select transistors HVN in the first direction FD is small. Therefore, since the size of the first pad PAD1, and the distance between the adjacent first pads PAD1, can be increased, an alignment margin in the bonding process between the cell wafer and the peripheral wafer can be improved, and defects which occur in the wafer bonding process can be reduced to improve the yield.

Figure 9:
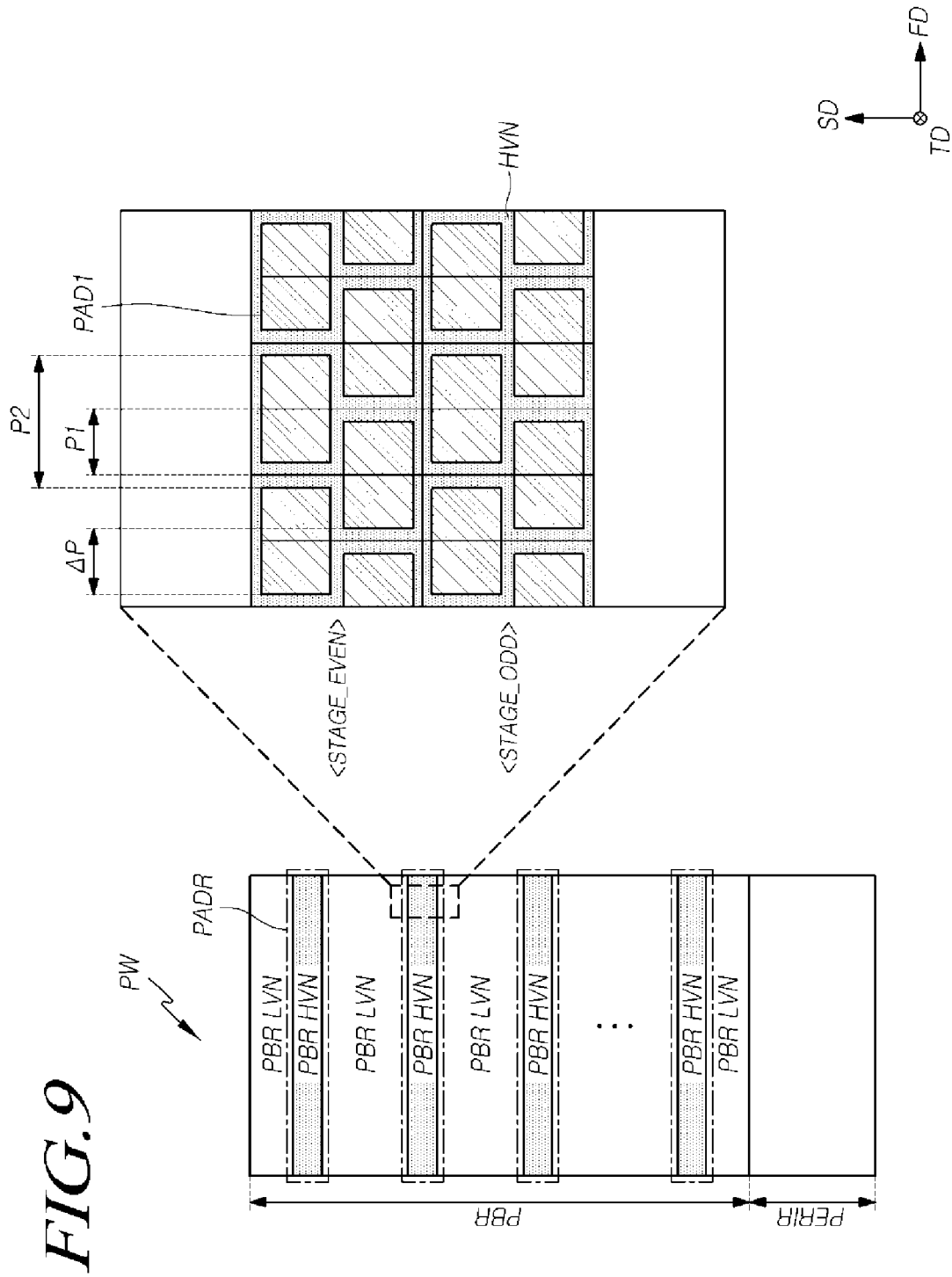
FIGS. 9 and 10 are plan views illustrating a layout of peripheral wafer-side pads of semiconductor memory devices in accordance with embodiments of the disclosure.

FIG. 9 is a plan view illustrating a layout of peripheral wafer-side pads of a semiconductor memory device in accordance with an embodiment of the disclosure.

Referring to FIG. 9, the first pads PAD1 disposed in adjacent columns may be disposed, in the first direction FD, with an offset corresponding to a first width ΔP. The first width ΔP may be smaller than the pitch P2 of the first pad PAD1 in the first direction FD. For example, the first width ΔP may be substantially equal to the pitch P1 of the bit line select transistor HVN in the first direction FD. The first pads PAD1 may be disposed in a zigzag shape in the second direction SD.

Figure 10:
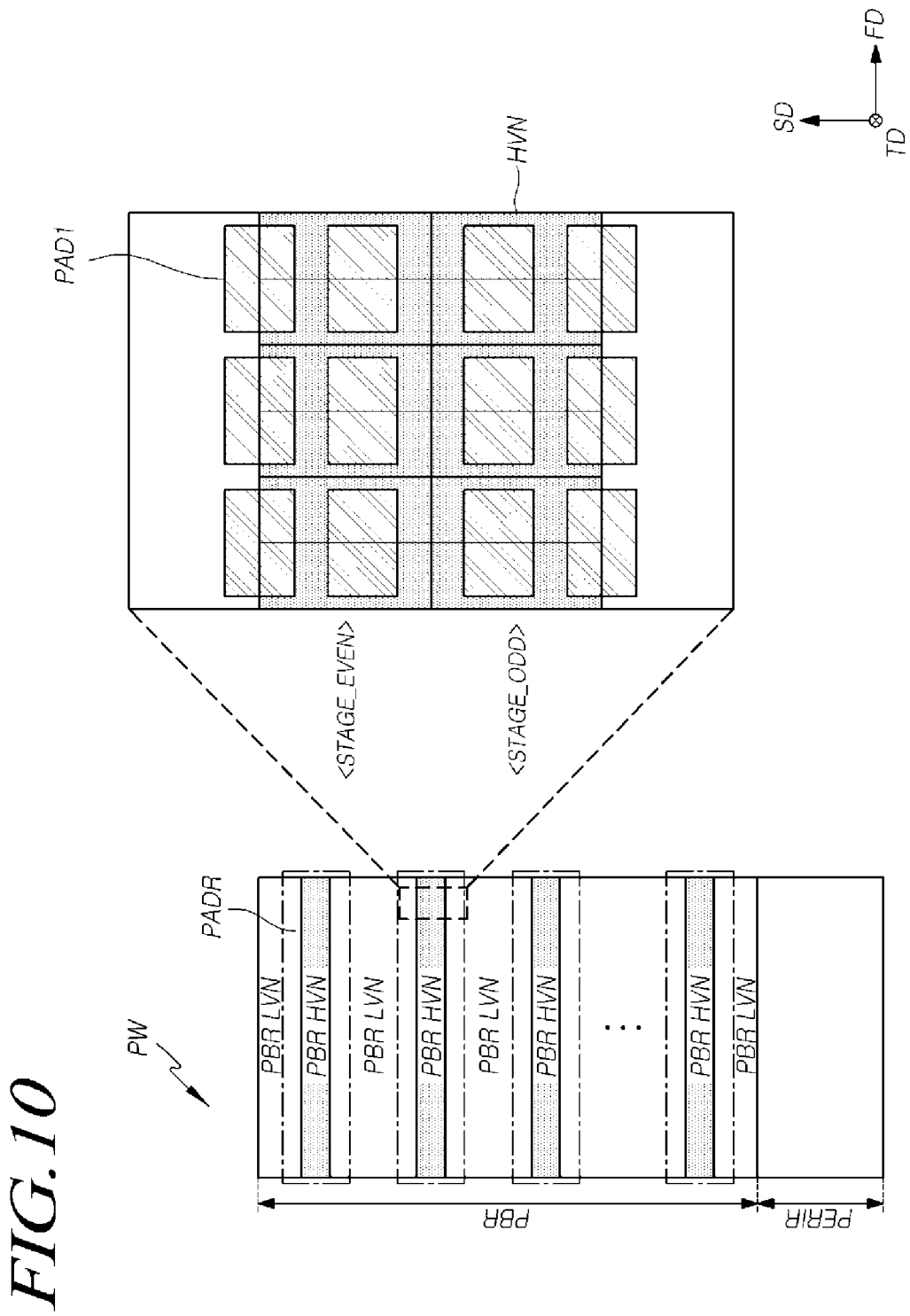
Figure 11:
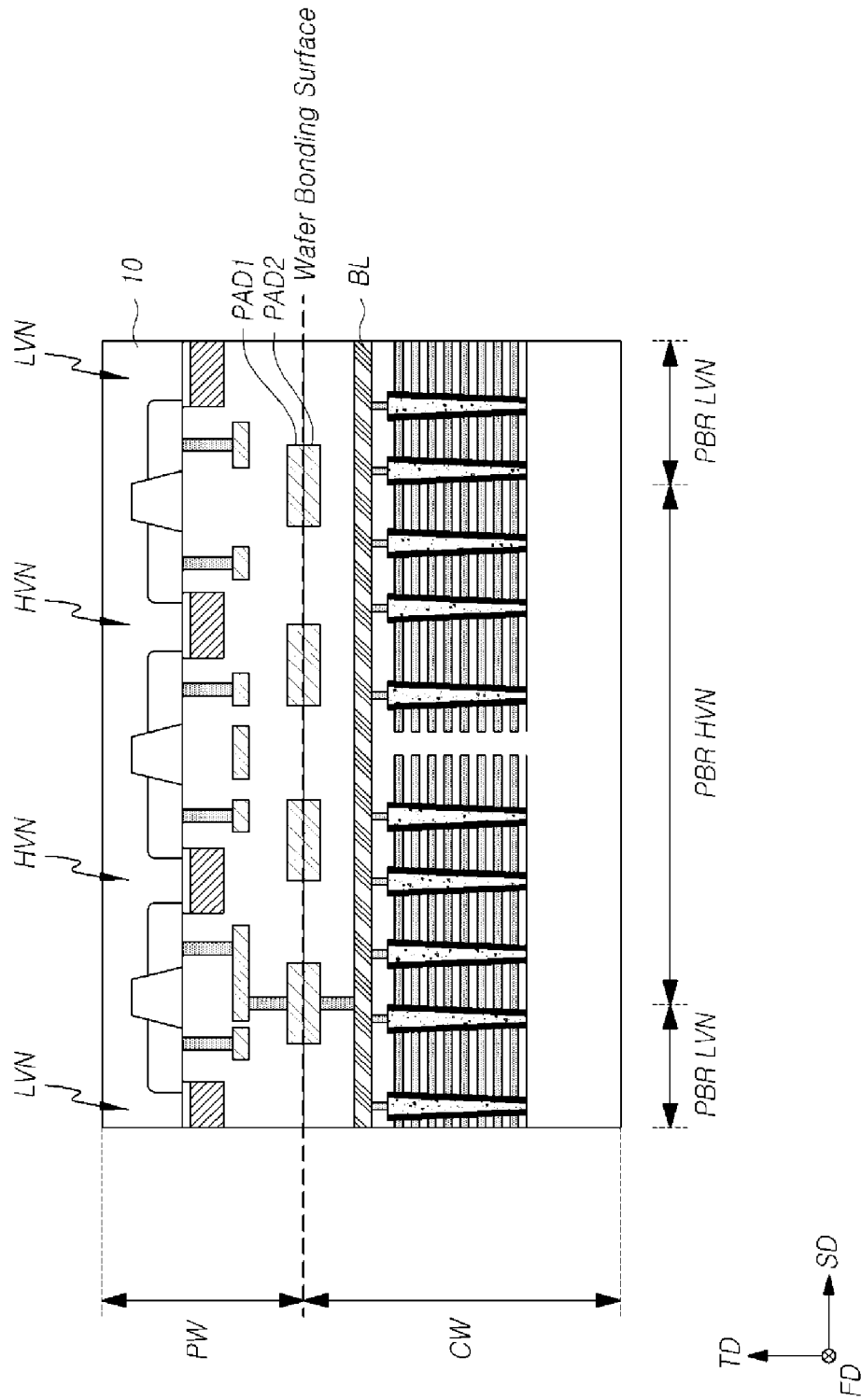
FIG. 11 is a cross-sectional view illustrating a portion of a semiconductor memory device including a peripheral wafer illustrated in FIG. 10.

FIG. 10 is a plan view illustrating a layout of peripheral wafer-side pads of a semiconductor memory device in accordance with an embodiment of the disclosure, and FIG. 11 is a cross-sectional view illustrating a portion of a semiconductor memory device including a peripheral wafer illustrated in FIG. 10.

Referring to FIGS. 10 and 11, a plurality of pad regions PADR corresponding to the high voltage regions PBRHVN may be provided. The pad regions PADR may be spaced apart from each other with a distance provided therebetween in the second direction SD. The distance between the adjacent pad regions PADR may be smaller than the width of the low voltage region PBRLVN in the second direction SD.

Each of the pad regions PADR may overlap the corresponding high voltage region PBRHVN and a pair of low voltage regions PBRLVN adjacent thereto. The width of the pad region PADR in the second direction SD may be larger than the width of the high voltage region PBRHVN in the second direction SD. Some of the first pads PAD1 may overlap the high voltage region PBRHVN and the low voltage region PBRLVN adjacent to the high voltage region PBRHVN. Other first pads PAD1 may overlap only with the high voltage region PBRHVN.

Because the width of the pad region PADR in the second direction SD is larger than the width of the high voltage region PBRHVN in the second direction SD, and because some of the first pads PAD1 are disposed to overlap the high voltage region PBRHVN and the low voltage region PBRLVN adjacent to the high voltage region PBRHVN, the pitch of the first pads PAD1 in the second direction SD can be increased. Therefore, the size of the first pad PAD1 and the distance between the adjacent first pads PAD1 can be increased in the second direction SD, which makes it possible to improve an alignment margin of the bonding process between the cell wafer and the peripheral wafer, and to suppress defects which occur in the wafer bonding process.

Figure 12:
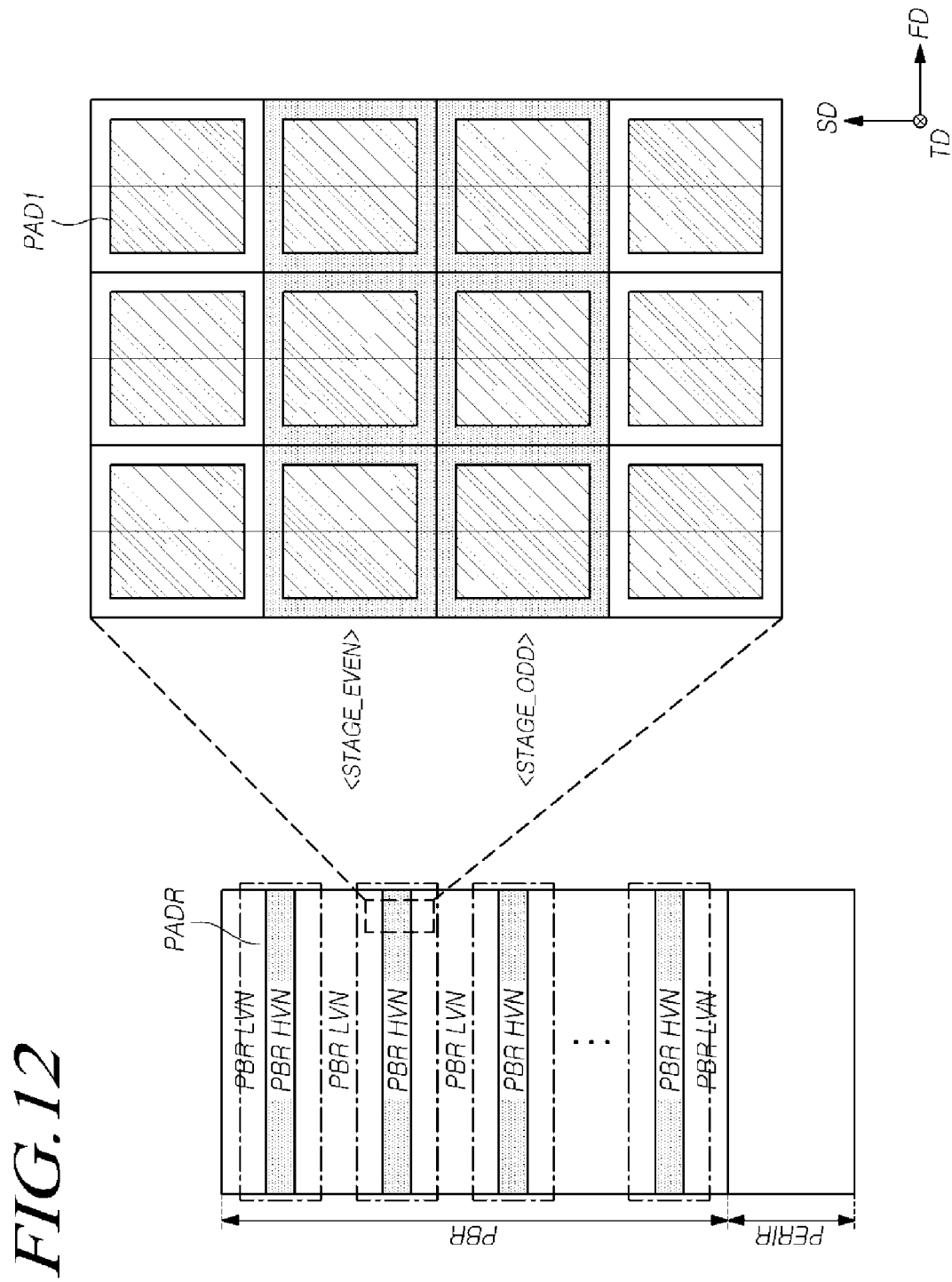
FIG. 12 is a plan view illustrating a layout of peripheral wafer-side pads of a semiconductor memory device in accordance with an embodiment of the disclosure.
Figure 13:
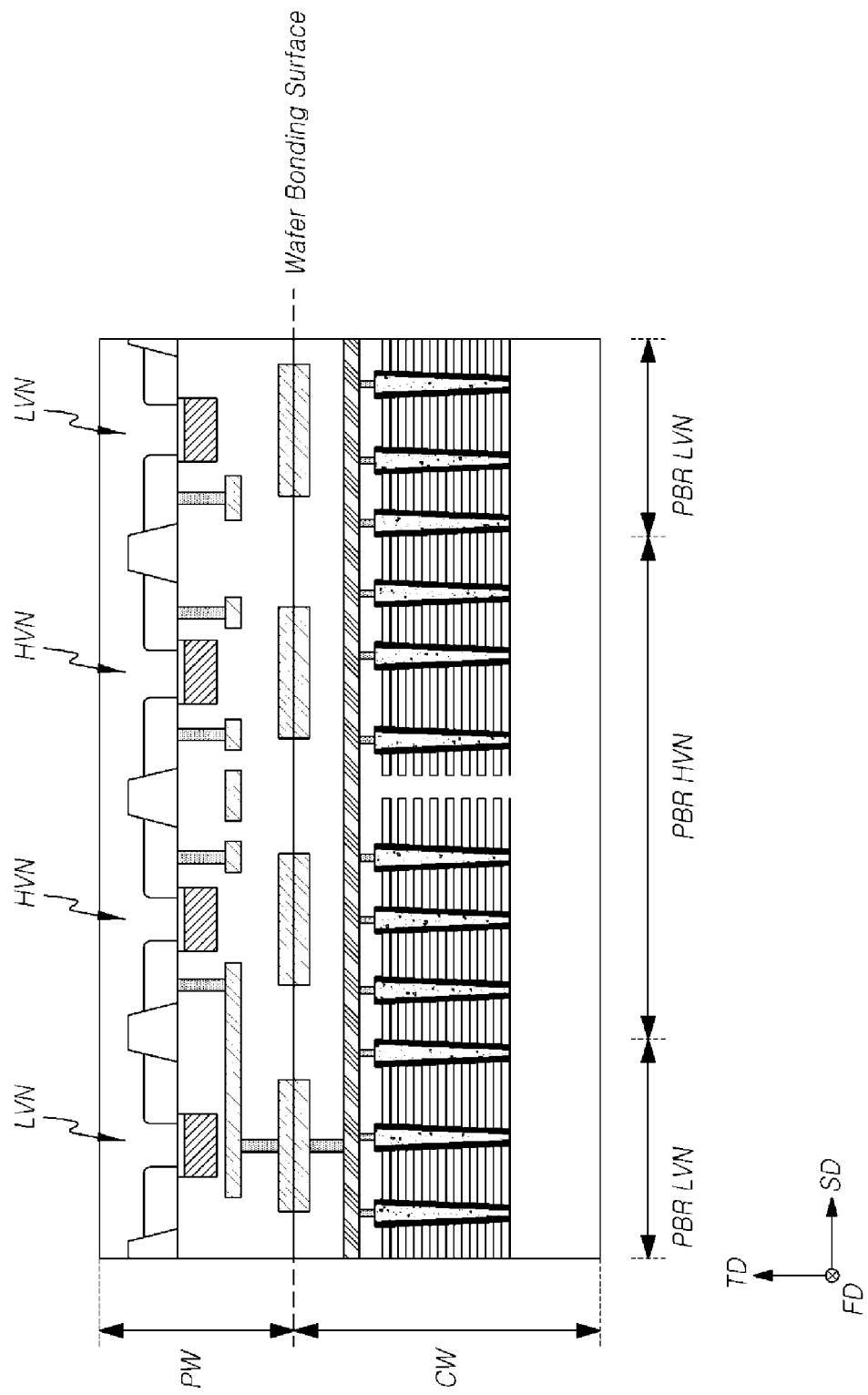
FIG. 13 is a cross-sectional view illustrating a portion of a semiconductor memory device including a peripheral wafer illustrated in FIG. 12.

FIG. 12 is a plan view illustrating a layout of peripheral wafer-side pads of a semiconductor memory device in accordance with an embodiment of the disclosure, and FIG. 13 is a cross-sectional view illustrating a portion of a semiconductor memory device including a peripheral wafer illustrated in FIG. 12.

Referring to FIGS. 12 and 13, a plurality of pad regions PADR corresponding to the high voltage regions PBRHVN may be provided. The pad regions PADR may be spaced apart from each other with a distance provided therebetween in the second direction SD. The distance between the adjacent pad regions PADR may be smaller than the width of the low voltage region PBRLVN in the second direction SD.

Each of the pad regions PADR may overlap the corresponding high voltage region PBRHVN and a pair of low voltage regions PBRLVN adjacent thereto. The width of the pad region PADR in the second direction SD may be larger than the width of the high voltage region PBRHVN in the second direction SD. The first pads PAD1 may be distributed and disposed in the high voltage regions PBRHVN and the low voltage regions PBRLVN adjacent to the high voltage regions PBRHVN. Some of the first pads PAD1 may not overlap the corresponding high voltage region PBRHVN, but overlap the low voltage regions PBRLVN. The other first pads PAD1 may overlap the high voltage regions PBRHVN.

Because the width of the pad region PADR in the second direction SD is larger than the width of the high voltage region PBRHVN in the second direction SD, and because some of the first pads PAD1 are disposed to overlap the low voltage region PBRLVN, the pitch of the first pads PAD1 in the second direction SD can be increased. Therefore, the size of the first pad PAD1 and the distance between the adjacent first pads PAD1 can be increased in the second direction SD, which makes it possible to improve an alignment margin of the bonding process between the cell wafer and the peripheral wafer, and to suppress defects which occur in the wafer bonding process.

Figure 14:
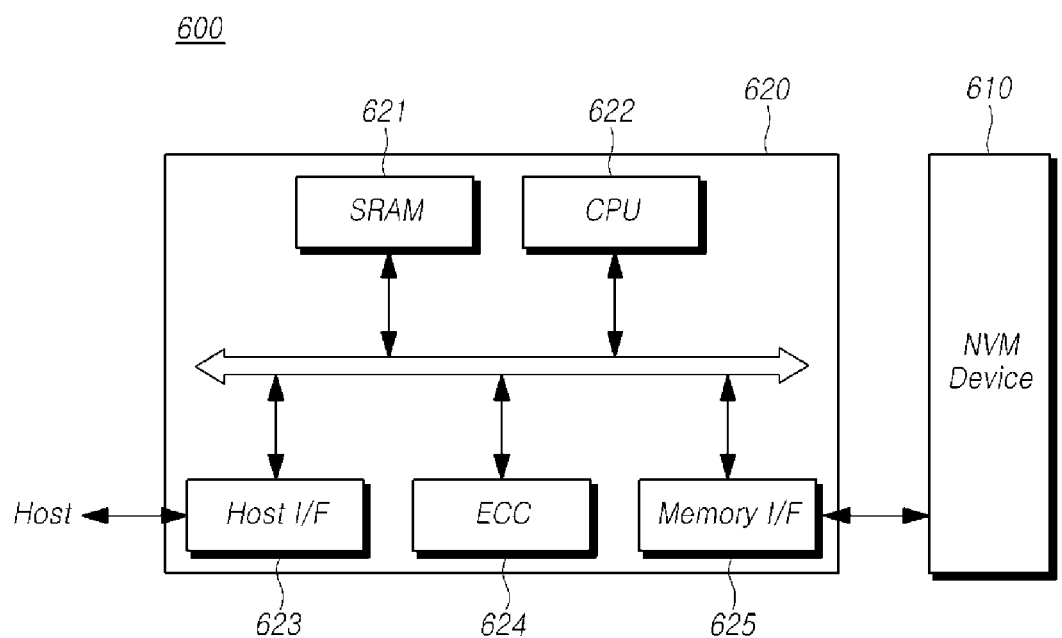
FIG. 14 is a diagram schematically illustrating a memory system including a semiconductor memory device in accordance with an embodiment of the disclosure.

FIG. 14 is a block diagram schematically illustrating an example of a memory system including a semiconductor memory device in accordance with an embodiment of the disclosure.

Referring to FIG. 14, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 15:
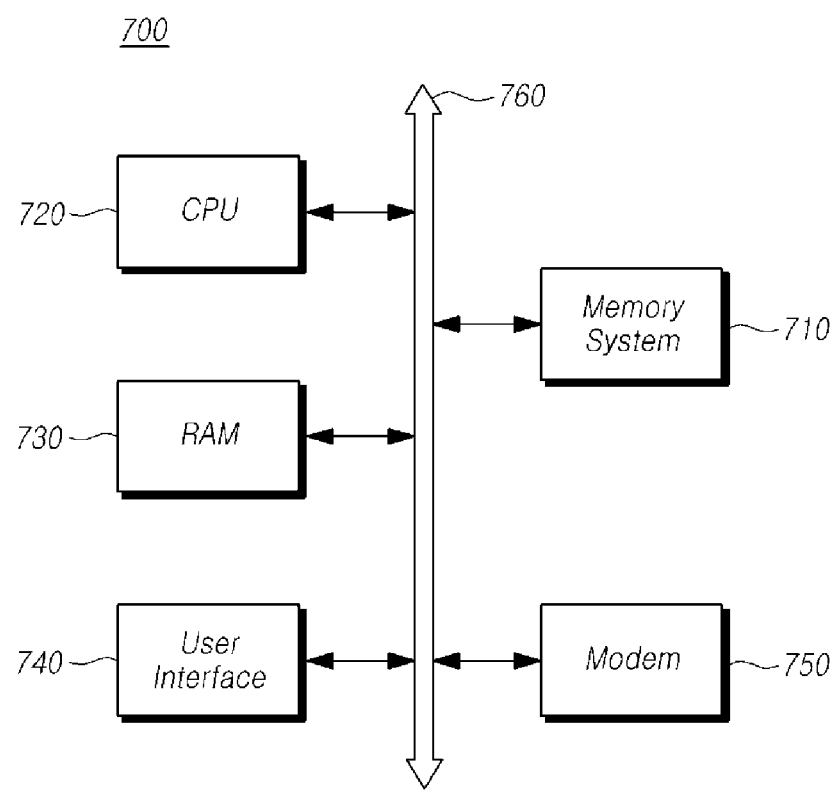
FIG. 15 is a block diagram schematically illustrating a computing system including a semiconductor memory device in accordance with an embodiment of the disclosure.

FIG. 15 is a block diagram schematically illustrating an example of a computing system including a semiconductor memory device in accordance with an embodiment of the disclosure.

Referring to FIG. 15, a computing system 700 in accordance with an embodiment may include a memory system 710, a microprocessor 720, a RAM 730, a user interface 740 and a modem 750 such as a base band chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an One NAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
a plurality of page buffers disposed on a substrate; and
a plurality of pads exposed to one surface of a dielectric layer covering the page buffers, and coupled to the respective page buffers,
wherein the substrate comprises a plurality of high voltage regions and a plurality of low voltage regions which are alternately disposed in a second direction crossing a first direction,
each of the plurality of page buffers comprises a sensing unit and a bit line select transistor coupled between the sensing unit and one of the plurality of pads, and
the bit line select transistors of the plurality of page buffers are disposed in the plurality of high voltage regions, and the plurality of pads are distributed and disposed in a plurality of pad regions which correspond to the plurality of high voltage regions and are spaced apart from each other in the second direction.

2. The semiconductor memory device of claim 1, wherein each of the plurality of pad regions overlaps a corresponding high voltage region, and a width of each of the plurality of pad regions in the second direction is equal to a width of the corresponding high voltage region in the second direction.

3. The semiconductor memory device of claim 1, wherein each of the plurality of pad regions overlaps a corresponding high voltage region and portions of a pair of low voltage regions adjacent to the high voltage region, and
a width of each of the plurality of pad regions in the second direction is larger than a width of the corresponding high voltage region in the second direction.

4. The semiconductor memory device of claim 3, wherein some of the plurality of pads overlap the high voltage region and a low voltage region adjacent to the high voltage region.

5. The semiconductor memory device of claim 3, wherein some of the plurality of pads overlap the low voltage region and do not overlap the high voltage region.

6. The semiconductor memory device of claim 1, wherein a pitch of the plurality of pads in the first direction is larger than a pitch of the bit line select transistors in the first direction.

7. The semiconductor memory device of claim 1, wherein each of the plurality of pads overlaps two or more bit line select transistors disposed adjacent to each other in the first direction.

8. The semiconductor memory device of claim 1, wherein a number of the plurality of pads disposed in the first direction is smaller than a number of the bit line select transistors disposed in the first direction.

9. A semiconductor memory device comprising:
a peripheral wafer comprising a plurality of page buffers and a plurality of first pads coupled to the respective page buffers, and having one surface with the first pads disposed thereon; and
a cell wafer comprising: a plurality of second pads disposed at one surface and bonded to the one surface of the peripheral wafer and coupled to the respective first pads; a plurality of bit lines coupled to the plurality of second pads, extended in a second direction crossing a first direction, and arranged in the first direction; and a memory cell array coupled to the plurality of bit lines,
wherein each of the plurality of page buffers comprises a sensing unit configured to sense a signal of the bit line and a bit line select transistor coupled between the sensing unit and the first pad,
the peripheral wafer comprises a plurality of high voltage regions and a plurality of low voltage regions which are alternately disposed in the second direction,
the bit line select transistors of the plurality of page buffers are disposed in the plurality of high voltage regions, and
the plurality of first pads is disposed in a plurality of pad regions which correspond to the plurality of high voltage regions and are spaced apart from each other in the second direction.

10. The semiconductor memory device of claim 9, wherein each of the plurality of pad regions overlaps a corresponding high voltage region, and a width of each of the plurality of pad regions in the second direction is equal to a width of the corresponding high voltage region in the second direction.

11. The semiconductor memory device of claim 9, wherein each of the plurality of pad regions overlaps a corresponding high voltage region and portions of a pair of low voltage regions adjacent to the high voltage region, and
a width of each of the plurality of pad regions in the second direction is larger than a width of the corresponding high voltage region in the second direction.

12. The semiconductor memory device of claim 11, wherein some of the plurality of first pads overlap the high voltage region and a low voltage region adjacent to the high voltage region.

13. The semiconductor memory device of claim 11, wherein some of the plurality of first pads overlap the low voltage region and do not overlap the high voltage region.

14. The semiconductor memory device of claim 9, wherein a pitch of the plurality of first pads in the first direction is larger than a pitch of the bit line select transistors in the first direction.

15. The semiconductor memory device of claim 9, wherein each of the plurality of first pads overlaps two or more bit line select transistors disposed adjacent to each other in the first direction.

16. The semiconductor memory device of claim 9, wherein a number of the plurality of first pads disposed in the first direction is smaller than a number of the bit line select transistors disposed in the first direction.

17. The semiconductor memory device of 9, wherein the memory cell array comprises:
a plurality of vertical channels coupled to the plurality of bit lines; and
a plurality of electrode layers and a plurality of interlayer dielectric layers, which are alternately stacked along the plurality of vertical channels.

18. The semiconductor memory device of claim 9, wherein a pitch of the plurality of second pads in the first direction is equal to a pitch of the plurality of first pads in the first direction.

19. The semiconductor memory device of claim 9, wherein a number of the plurality of second pads disposed in the first direction is equal to number of the plurality of first pads disposed in the first direction.

* * * * *